(12) United States Patent
Choi et al.

(10) Patent No.: US 10,382,659 B2
(45) Date of Patent: Aug. 13, 2019

(54) SURVEILLANCE CAMERA SYSTEM

(71) Applicant: Hanwha Techwin Co., Ltd., Changwon-si (KR)

(72) Inventors: Youn Sik Choi, Changwon-si (KR); Chang Bok Lee, Changwon-si (KR); Mee Jee Jeong, Changwon-si (KR)

(73) Assignee: HANWHA TECHWIN CO., LTD., Seongnam-si (KR)

( * ) Notice: Subject to any disclaimer, the term of this patent is extended or adjusted under 35 U.S.C. 154(b) by 130 days.

(21) Appl. No.: 15/593,433

(22) Filed: May 12, 2017

(65) Prior Publication Data
US 2018/0013938 A1 Jan. 11, 2018

(30) Foreign Application Priority Data

Jul. 5, 2016 (KR) .................. 10-2016-0085075
Jul. 6, 2016 (KR) .................. 10-2016-0085601

(51) Int. Cl.
| H04N 5/225 | (2006.01) |
| H04N 5/232 | (2006.01) |
| H05K 1/18 | (2006.01) |
| H05K 1/02 | (2006.01) |
| H05K 1/14 | (2006.01) |

(52) U.S. Cl.
CPC ......... *H04N 5/2253* (2013.01); *H04N 5/2252* (2013.01); *H04N 5/232* (2013.01); *H04N 5/23296* (2013.01); *H05K 1/028* (2013.01); *H05K 1/189* (2013.01); *H05K 1/147* (2013.01); *H05K 2201/09063* (2013.01); *H05K 2201/10121* (2013.01)

(58) Field of Classification Search
CPC ........ H05K 1/189; H05K 1/028; H05K 1/147; H05K 2201/09063; H05K 2201/10121; H05K 1/118; H04N 5/2252; H04N 5/2253; H04N 5/232; H04N 5/23296; H04N 7/18
See application file for complete search history.

(56) References Cited

U.S. PATENT DOCUMENTS

| 3,818,122 | A | 6/1974 | Luetzow |
| 8,753,143 | B2 | 6/2014 | Su et al. |
| 2007/0077805 | A1* | 4/2007 | Nomura ................. G03B 17/04 439/331 |

(Continued)

FOREIGN PATENT DOCUMENTS

| JP | 2011-102939 A | 5/2011 |
| JP | 2012-146900 A | 8/2012 |
| JP | 5802192 B2 | 10/2015 |

*Primary Examiner* — Anner N Holder
(74) *Attorney, Agent, or Firm* — Sughrue Mion, PLLC

(57) ABSTRACT

A surveillance camera system includes a camera portion; a base portion supporting the camera portion to be rotatable, and including a main circuit board; a flexible printed circuit board (FPCB) connecting the camera portion to the main circuit board, and including a first end portion connected to the camera portion, a second end portion connected to the main circuit board, and a conductive line extension portion disposed between the first end portion and the second end portion, wherein a plurality of slits are arranged in the conductive line extension portion; and a first binding member and a second binding member respectively surrounding a part of the conductive line extension portion and being spaced apart from each other.

18 Claims, 8 Drawing Sheets

(56) References Cited

U.S. PATENT DOCUMENTS

2011/0067903 A1* 3/2011 Lin .................. H05K 1/028
                                              174/254
2012/0188441 A1* 7/2012 Takizawa ............ H04N 5/2251
                                              348/374

* cited by examiner

SURVEILLANCE CAMERA SYSTEM

CROSS-REFERENCE TO THE RELATED APPLICATIONS

This application claims priority from Korean Patent Application No. 10-2016-0085075, filed on Jul. 5, 2016 and Korean Patent Application No. 10-2016-0085601, filed on Jul. 6, 2016 in the Korean Intellectual Property Office, the disclosures of which are incorporated herein in their entirety by reference.

BACKGROUND

1. Field

Apparatuses and methods consistent with exemplary embodiments relate to a surveillance camera system, and more particularly, to a surveillance camera system including a flexible printed circuit board (FPCB).

2. Description of the Related Art

Surveillance cameras are typically installed at places of business such as an office or a bank that requires a high degree of security, or may be installed outdoors at a high vantage point in order to monitor automobile or foot traffic in real-time.

A surveillance camera may be configured for panning, tilting, and rolling with respect to a base, taking into account a location of the area to be monitored and a degree of magnification (e.g., zoom) during the installation and/or deployment of the camera.

In order to drive down the cost of manufacturing a surveillance camera, a cheaper material may be used to replace a cable that connects the camera to its base.

SUMMARY

Since the FPCB is formed of wires in single or multi-layers on a plate-shaped insulating substrate having flexibility, damage such as tearing or denting of the FPCB may occur when panning and rolling of the camera are repeatedly performed with respect to the base.

One or more exemplary embodiments include a surveillance camera system capable of preventing damage to a flexible printed circuit board (FPCB) at reduced cost.

Additional aspects will be set forth in part in the description which follows and, in part, will be apparent from the description, or may be learned by practice of the presented embodiments.

According to an aspect of an exemplary embodiment, a surveillance camera system may include: a camera portion; a base portion supporting the camera portion to be rotatable, and comprising a main circuit board; a flexible printed circuit board (FPCB) connecting the camera portion to the main circuit board, and including a first end portion connected to the camera portion, a second end portion connected to the main circuit board, and a conductive line extension portion disposed between the first end portion and the second end portion, wherein a plurality of slits are arranged in the conductive line extension portion; and a first binding member and a second binding member respectively surrounding a part of the conductive line extension portion and being spaced apart from each other.

The plurality of slits may be a plurality of openings having widths substantially equal to one another.

The plurality of slits may include slits having varying lengths.

The lengths of the plurality of slits may increase as the plurality of slits are arranged farther away from a center line of the FPCB, and the center line is a line extending along a lengthwise direction of the FPCB.

Distances between the plurality of slits and the first end portion may decrease as the plurality of slits are arranged farther away from the center line of the FPCB.

A width of a region where the plurality of slits are arranged in the FPCB may be greater than a width of the first end portion and a width of the second end portion, and the width of the region may be a width in a direction substantially perpendicular to a lengthwise direction of the FPCB.

The plurality of slits may be arranged throughout a first region surrounded by the first binding member, a second region surrounded by the second binding member, and a third region between the first region and the second region in the FPCB.

The FPCB may include a plurality of branches separated from one another by the plurality of slits in at least a partial area, and the plurality of branches may be separated from one another in the third region.

The plurality of branches may be stacked so that surfaces of the plurality of branches sequentially contact one another in at least the first region and the second region respectively by the first binding member and the second binding member.

Each of the plurality of branches may have a width of 5 mm or less.

The surveillance camera system may further include a plurality of auxiliary slits arranged between the first region and the first end portion, and separated from the plurality of slits.

The plurality of auxiliary slits may include slits having varying lengths.

The lengths of the plurality of auxiliary slits may decrease as the plurality of auxiliary slits are arranged farther away from the center line of the FPCB.

The FPCB may include a reinforcing region arranged between the second region and the second end portion and having a rigidity greater than rigidities of other regions of the FPCB.

A length of the reinforcing region at a first portion adjacent to the center line of the FPCB may be greater in a lengthwise direction of the FPCB than a length of the reinforcing region at a second portion farther away than the first portion from the center line.

The FPCB may include: a flexible substrate; a plurality of conductive lines arranged on the flexible substrate and extending in a lengthwise direction of the FPCB; and an insulating cover covering the plurality of conductive lines, wherein the plurality of slits may be a plurality of openings formed in a region corresponding to a space between the plurality of conductive lines of the insulating cover and the flexible substrate.

A region in the FPCB between the second binding member and the second end portion may include a fourth region in which the plurality of slits are arranged, and a fifth region arranged between the fourth region and the second end portion, the fifth region having a constant width. A length d of the fourth region in a lengthwise direction of the FPCB and a width L of the fifth region in a direction perpendicular to the lengthwise direction may satisfy a condition $0.5 < d/L < 2$. The lengthwise direction may denote a direction of a line connecting the first end portion to the second end portion.

A region in the FPCB between the first binding member and the first end portion may include a fourth region in which the plurality of slits are arranged, and a fifth region arranged between the fourth region and the second end portion, the fifth region having a constant width. A length d of the fourth region in a lengthwise direction of the FPCB and a width L of the fifth region in a direction perpendicular to the lengthwise direction may satisfy a condition $0.5<d/L<2$.

The camera portion may include a lens system and an image sensor receiving light that has passed through the lens system to convert the light into an electric signal, and the first end portion of the FPCB may be connected to the image sensor.

The camera portion may be supported by the base portion, to be capable of panning, tilting, and rolling with respect to the base portion.

According to an aspect of an exemplary embodiment, a surveillance camera system may include: a camera portion; a base portion supporting the camera portion to be rotatable, and including a main circuit board; a flexible printed circuit board (FPCB) connecting the camera portion to the main circuit board, and including a first end portion connected to the camera portion, a second end portion connected to the main circuit board, and a conductive line extension portion between the first end portion and the second end portion, wherein the conductive line extension portion includes a fixing portion coupled to the base portion, being spaced apart from the main circuit board.

The base portion may further include an upper supporter including a through hole, through which the FPCB penetrates, and the fixing portion may be coupled to the upper supporter.

The FPCB may include a coupling hole formed in the fixing portion, and the upper supporter may include a frame surrounding the through hole and including a fixing hook protruding towards the through hole, and the fixing hook may be inserted to the coupling hole.

The coupling hole may have a first width, and the fixing hook may have a region having a second width that is greater than the first width.

The plurality of slits may be arranged between the fixing portion and the first end portion.

The surveillance camera system may further include an attaching unit or a fixing unit for coupling the fixing portion to the upper supporter.

The main circuit board may include a connector, and the second end portion may be inserted and coupled to the connector.

Other aspects, features, and merits other than the aforementioned aspects, features and merits will be clear from the following drawings, claims and detained description of the present disclosure.

BRIEF DESCRIPTION OF THE DRAWINGS

The above and/or other aspects will become apparent and more readily appreciated from the following description of various exemplary embodiments, taken in conjunction with the accompanying drawings in which.

DETAILED DESCRIPTION

Figure 1:
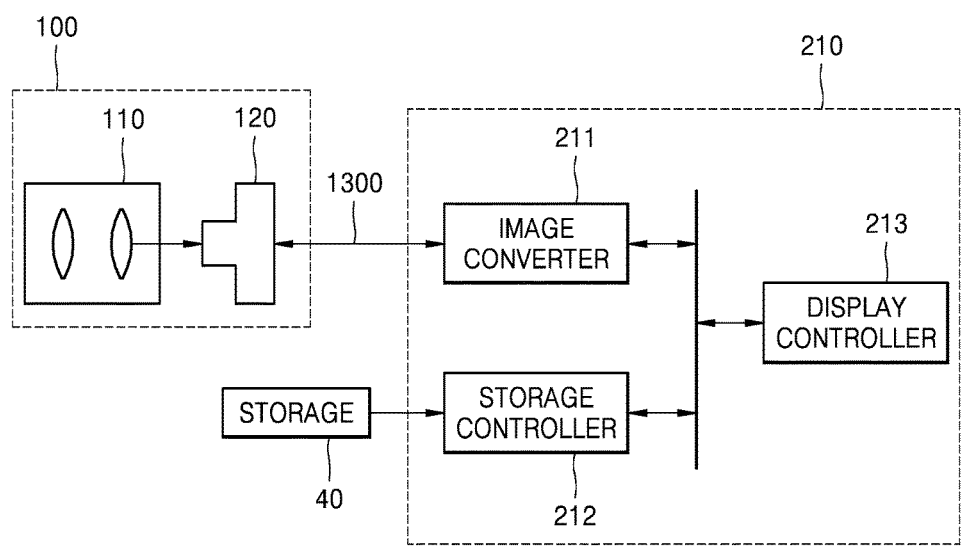
FIG. 1 is a block diagram of a surveillance camera system according to an exemplary embodiment.

Reference will now be made in detail to exemplary embodiments, which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. The word "exemplary" is used herein to mean "serving as an example or illustration." Any aspect or design described herein as "exemplary" is not necessarily to be construed as preferred or advantageous over other aspects or designs.

As the inventive concept allows for various changes and numerous embodiments, particular embodiments will be illustrated in the drawings and described in detail in the written description. However, this is not intended to limit the present disclosure to particular modes of practice, and it is to be appreciated that all modifications, equivalents, and/or alternatives that do not depart from the spirit and technical scope are encompassed in the inventive concept. In the description, certain detailed explanations of the related art are omitted when it is deemed that they may unnecessarily obscure the essence of the present disclosure.

The exemplary embodiments will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various components, these components should not be limited by these terms. Terms are only used to distinguish one element from other elements.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Sizes of components in the drawings may be exaggerated for convenience of explanation. In other words, since sizes and thicknesses of components in the drawings are arbitrarily illustrated for convenience of explanation, the following embodiments are not limited thereto.

FIG. 1 is a block diagram of a surveillance camera system according to an exemplary embodiment.

Referring to FIG. 1, the surveillance camera system according to the present embodiment includes a camera portion 100 and a main circuit board 210 connected to the camera portion 100 via a flexible printed circuit board (FPCB) 1300.

The camera portion 100 includes a lens system 110 for focusing an external image onto an image plane of an image sensor 120, and the image sensor 120 for receiving light that has passed through the lens system 110 to convert the light into an electric signal. The lens system 110 includes at least one lens, and the lens system 110 may be a single lens (e.g., prime lens or single focus-length lens) having no zooming function or a zoom lens having a zooming function. In the case of the zoom lens, a plurality of lenses having variable intervals therebetween may be provided for performing a zooming function. The lens system 110 may further include a stop for adjusting an incident light intensity.

The image sensor 120 includes a photoelectric conversion device such as a charge coupled device (CCD) or a complementary metal oxide semiconductor (CMOS), and converts the image light incident through the lens system 110 into an image signal, that is, an electric signal. A process of converting the image light into the electric signal may include a step of converting the image beam into an analog signal and a step of converting the analog signal to a digital signal.

The main circuit board 210 is arranged on a base portion 200 (see FIG. 2), and the camera portion 100 may be installed to be rotatable with respect to the base portion 200. The main circuit board 210 is electrically connected to the camera portion 100.

The camera portion 100 may perform a rotating movement such as panning, tilting, and/or rolling with respect to the main circuit board 210 arranged on the base portion 200. Therefore, a flexible printed circuit board (FPCB) 1300 having a high degree of flexibility may be used to connect the image sensor 120 to the main circuit board 210. That is, the FPCB 1300 connects the image sensor 120 to the main circuit board 210 so as to send/receive signals between the image sensor 120 and the main circuit board 210. A coaxial cable may be used for connecting the image sensor 120 and the main circuit board 210, but costs for manufacturing the surveillance camera system may increase due to the high cost of coaxial cables.

A detailed structure of the FPCB 1300 will be described later.

The main circuit board 210 includes an image converter 211, a storage controller 212, and a display controller 213. The image converter 211 is electrically connected to the camera portion 100 to send/receive control signals with the camera portion 100 or to process data. The storage controller 212 controls recording of image data in a storage 40 and writing and reading of image data or setting information recorded in the storage 40. The storage 40 may include, for example, a semiconductor memory device such as a synchronous dynamic random access memory (SDRAM), so as to store data of photographed images.

The display controller 213 controls a function of displaying captured images on a display that is included in or separated from the surveillance camera system and communicates with the surveillance camera system.

The above structure of the main circuit board 210 is an example, that is, the main circuit board 210 may further include other components than those of the above configuration, and may not include at least some of the image converter 211, the storage controller 212, and the display controller 213.

Figure 2:
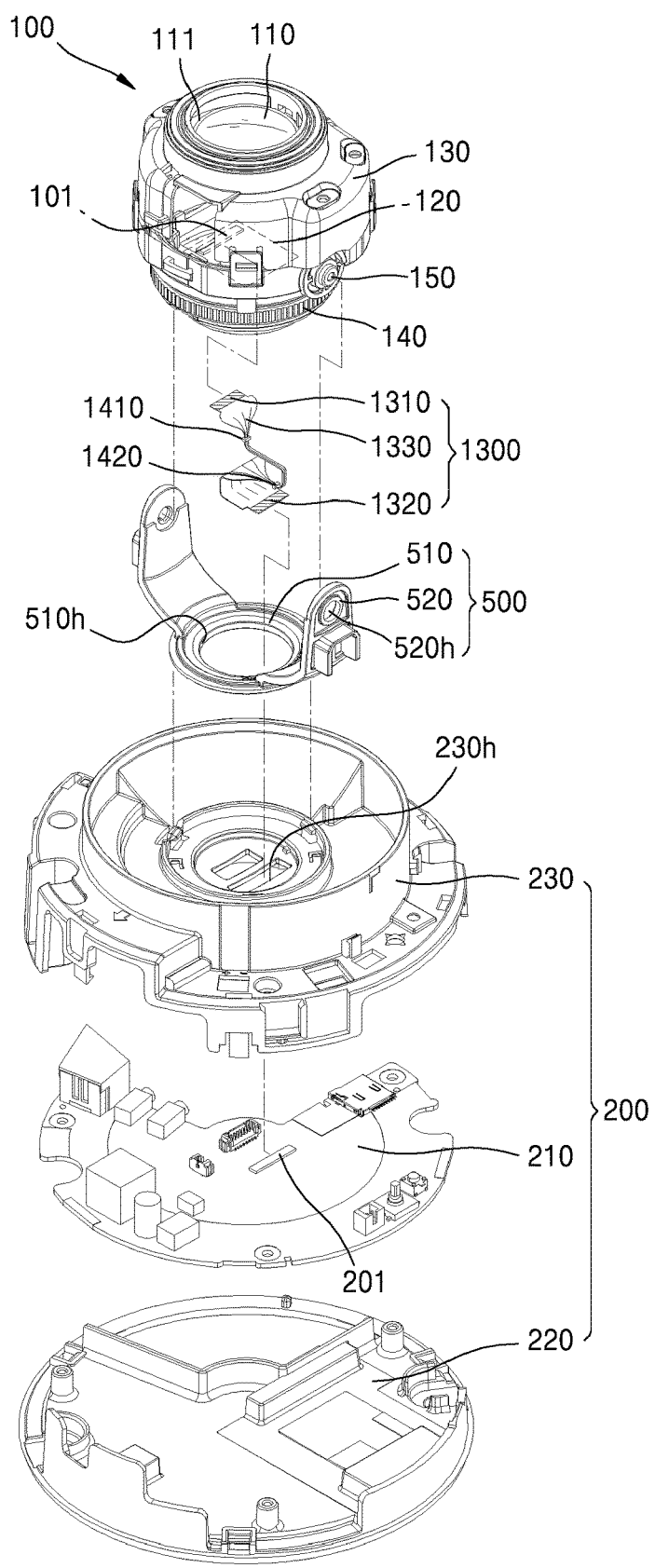
FIG. 2 is an exploded perspective view of a surveillance camera system according to an exemplary embodiment.
Figure 3:
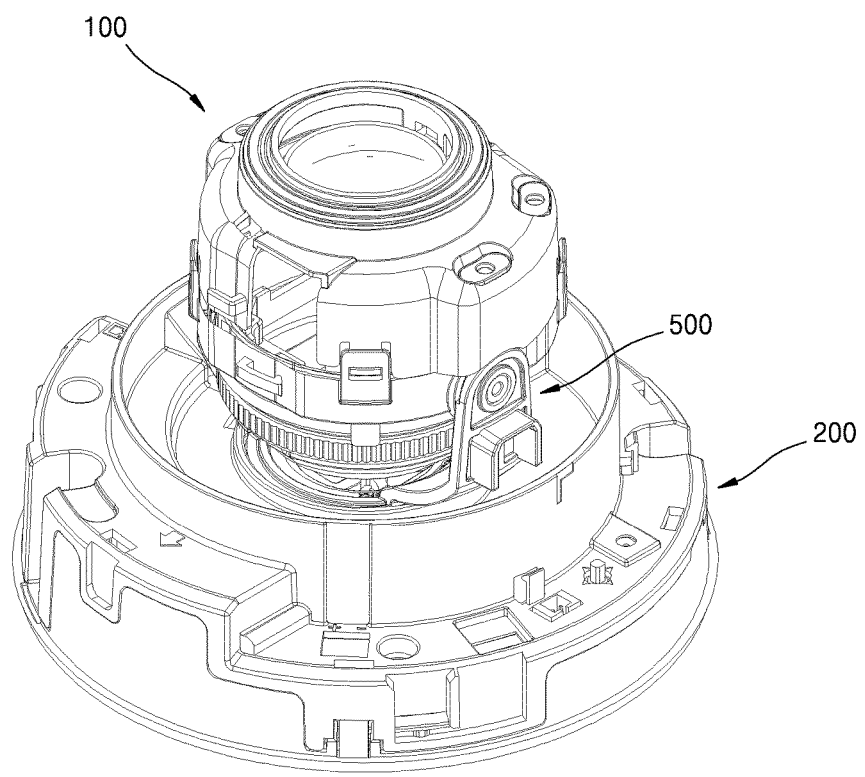
FIG. 3 is a perspective view of the surveillance camera system in which components of FIG. 2 are assembled.

FIG. 2 is an exploded perspective view of a surveillance camera system according to an exemplary embodiment, and FIG. 3 is a perspective view of the surveillance camera system in which components of FIG. 2 are assembled.

Referring to FIGS. 2 and 3, the surveillance camera system includes the camera portion 100, the base portion 200 supporting the camera portion 100 to be rotatable and including the main circuit board 210, and the FPCB 1300 connecting the camera portion 100 to the main circuit board 210. The FPCB 1300 includes a first end portion 1310 connected to the camera portion 100, a second end portion 1320 connected to the main circuit board 210, a conductive line extension portion 1330 between the first end portion 1310 and the second end portion 1320. A first binding member 1410 and a second binding member 1420, being separate from each other, respectively surround a part of the conductive line extension portion 1330.

The camera portion 100 includes the lens system 110 and the image sensor 120 receiving the light that has passed through the lens system 110 to convert the light into an electric signal. The FPCB 1300 may connect the image sensor 120 of the camera portion 100 to the main circuit board 210. The lens system 110 includes at least one lens, and may be a prime lens having no zooming function or a zoom lens having a zooming function. The image sensor 120 may be arranged behind the lens system 110 so as to receive the light focused by the lens system 110. The at least one lens is supported by a barrel 111, and the image sensor 120 may be fixed onto the barrel 111.

The camera portion 100 includes a housing 130 and a lens rotating portion 140, and the barrel 111 may rotate by being linked with a lens rotating portion 140. That is, the lens system 110 and the image sensor 120 may rotate by being linked with the lens rotating portion 140 about an optical axis, and the rotation may be a rolling operation with respect to the base portion 200.

The base portion 200 may include the main circuit board 210, a lower support 220, and an upper support 230. The main circuit board 210 may be arranged on the lower support 220, and may be covered by the upper support 230. The upper support 230 may include at least one opening 230h at a center portion thereof, and a part of the FPCB 1300 may be connected to the main circuit board 210 through the opening 230h formed in the upper support 230. For example, the main circuit board 210 includes a second connector 201, and the second end portion 1320 of the FPCB 1300 may be connected to the second connector 201.

A panning rotator 500 may be arranged between the base portion 200 and the camera portion 100, and the panning rotator 500 is supported by the base portion 200 to be capable of panning. The panning rotator 500 may include a base coupling portion 510 that is coupled to the base portion 200 and includes an opening 510h at a center portion thereof, and a camera coupling portion 520 protruding from the base coupling portion 510 to be coupled to the camera portion 100. That is, the camera portion 100 is supported by the base portion 200 so as to be capable of panning with respect to the base portion 200, together with the panning rotator 500.

The camera portion 100 includes at least one protrusion 150 protruding from the housing 130, and the camera coupling portion 520 of the panning rotator 500 may include at least one coupling hole 520h in which the protrusion 150 is inserted. For example, the camera portion 100 includes two protrusions 150 arranged symmetrically with each other with respect to the housing 130, and the camera coupling portion 520 may include two coupling holes 520h in which the two protrusions 150 are respectively inserted. After inserting the protrusion 150 in the coupling hole 520h, a coupling unit such as a screw may be used so that the protrusion 150 may not detach from the coupling hole 520h. Through the above coupling method, the camera portion 100 may be coupled to the panning rotator 500 to be capable of tilting. However, other coupling methods may be used, including an adhesive, a hook, a pin, a nail, etc. Consequently, the camera portion 100 may be supported by the base portion 200, so as to be capable of tilting with respect to the base portion 200.

As described above, the camera portion 100 is capable of rolling with respect to the base portion 200 via the lens rotator 140, panning with respect to the base portion 200 together with the panning rotator 500, and tilting with respect to the base portion 200 by being coupled to the panning rotator 500. That is, the camera portion 100 may be supported by the base portion 200 to be capable of panning, tilting, and rolling with respect to the base portion 200.

The surveillance camera system according to an aspect of an exemplary embodiment includes the FPCB 1300 that connects the image sensor 120 included in the camera portion 100 to the main circuit board 210 included in the base portion 200, and the FPCB 1300 includes the first end portion 1310 connected to the image sensor 120, the second end portion 1320 connected to the main circuit board 210, and the conductive line extension portion 1330 between the first end portion 1310 and the second end portion 1320. A plurality of slits 2300Sa (see FIG. 4) may be arranged in the conductive line extension portion 1330.

For example, the image sensor 120 and the main circuit board 210 may respectively include the first connector 101 and the second connector 201, and the first end portion 1310 and the second end portion 1320 of the FPCB 1300 may be inserted and coupled to the first connector 101 and the second connector 201, respectively.

The FPCB 1300 is obtained by arranging wires in single or multiple layers on a plate-shaped insulating substrate having flexibility, and since the camera portion 100 repeatedly performs panning and rolling operations with respect to the base portion 200, damages to the FPCB 1300 may occur, for example, the FPCB 1300 may be torn or dented.

The surveillance camera system according to an aspect of an exemplary embodiment may include the first binding member 1410 and the second binding member 1420 that respectively surround a part of the conductive line extension portion 1330 of the FPCB 1300 and are separate from each other. The first binding member 1410 and the second binding member 1420 may be tapes or insulating bands including an insulating base and an adhesive layer.

The FPCB 1300 is partially folded or overlaid by the first and second binding members 1410 and 1420, and a folded portion or an overlaid portion of the FPCB 1300 may have a width that is much smaller than that at the first end portion 1310 and the second end portion 1320. Through the above structure, twisting and/or creasing of the FPCB 1300 that may be caused by the repeated panning and rolling operations of the camera portion 100 may be prevented or reduced. That is, tearing and/or denting of the FPCB 1300 may be prevented or reduced by using the first and second binding members 1410 and 1420.

According to an aspect of an exemplary embodiment, the first and second binding members 1410 and 1420 are separated from each other, and a region between the first and second binding members 1410 and 1420 is not bound. Through the above configuration, reduction in flexibility that may be caused when the first and second binding members 1410 and 1420 surround a large area of the FPCB 1300 may be prevented. That is, the first and second binding members 1410 and 1420 surrounding the FPCB 1300 are spaced apart from each other, and the region between a region bound by the first binding member 1410 and the region bound by the second binding member 1420 is not bound so as to increase a degree of freedom of movement, thereby improving flexibility of the FPCB 1300.

Figure 4:
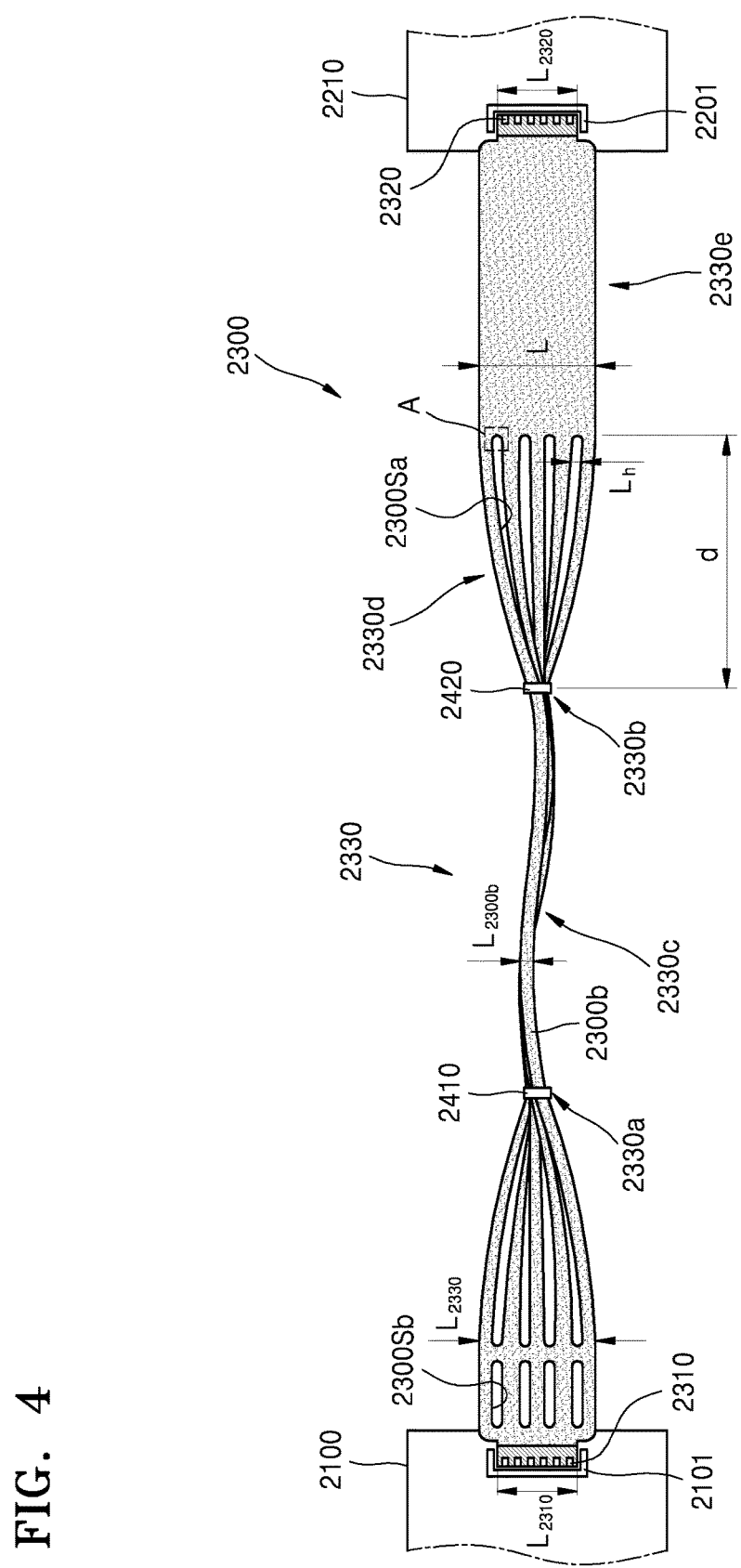
FIG. 4 is a schematic plan view of a flexible printed circuit board (FPCB) according to an exemplary embodiment.
Figure 5A:
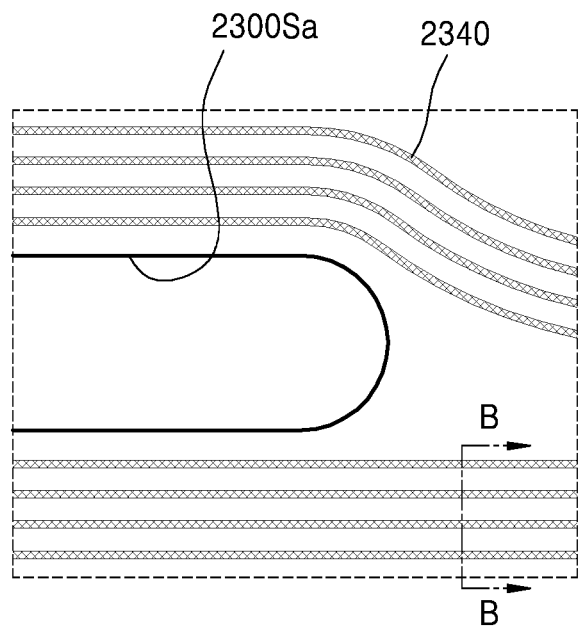
FIG. 5A is a plan view showing an enlarged view of a portion A in FIG. 4.
Figure 5B:
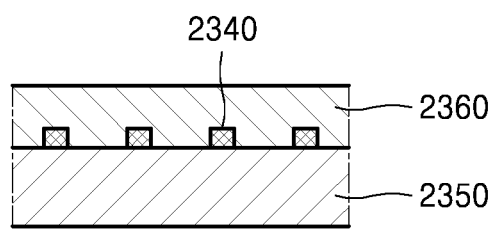
FIG. 5B is a cross-sectional view taken along with a line B of FIG. 5A.

FIG. 4 is a schematic plan view of an FPCB 2300 according to an exemplary embodiment, FIG. 5A is a plan view showing an enlarged view of a portion A in FIG. 4, and FIG. 5B is a cross-sectional view taken along a line B of FIG. 5A.

Referring to FIGS. 4, 5A, and 5B, the surveillance camera system may include the FPCB 2300 connecting a main circuit board 2210 included in the base portion to a camera portion 2100.

The FPCB 2300 includes a first end portion 2310 connected to the camera portion 2100, a second end portion 2320 connected to the main circuit board 2210, and a conductive line extension portion 2330 between the first end portion 2310 and the second end portion 2320. The camera portion 2100 may be supported by the base portion capable of panning, tilting, and/or rolling with respect to the main circuit board 2210. The first end portion 2310 of the FPCB 2300 may be connected to an image sensor included in the camera portion 2100.

The FPCB 2300 is bound by a first binding member 2410 and a second binding member 2420 that are spaced apart from each other, and may include a plurality of slits 2300Sa. According to the present embodiment, the first end portion 2310 and the second end portion 2320 may be respectively connected to a first connector 2101 arranged in the camera portion 2100 and to a second connector 2201 arranged in the main circuit board 2210.

The plurality of slits 2300Sa may be a plurality of openings having substantially the same widths Lh as one another. The plurality of openings may have square or circular shapes extending in a lengthwise direction of the FPCB 2300. That is, the plurality of slits 2300Sa may not be lines that are simply formed by cutting some parts of the FPCB 2300, but may be openings having predetermined widths Lh. Through the above structure, a plurality of branches (e.g., strands) 2300b that are partitioned by the plurality of slits 2300Sa may be easily bound by using the first and second binding members 2410 and 2420.

That is, as shown in FIG. 4, the plurality of branches 2300b partitioned by the plurality of slits 2300Sa may be sequentially stacked so that surfaces of the plurality of branches 2300b contact one another by using the first and second binding members 2410 and 2420.

According to an aspect of an exemplary embodiment, a width $L_{2300b}$ of each of the plurality of branches 2300b may be about 5 mm or less. That is, a width of a portion of the FPCB 2300, the portion being bound by the first and second binding members 2410 and 2420, may be about 5 mm or less due to overlapping of the plurality of branches 2300b with one another. Therefore, the FPCB 2300 includes the region having a small width of about 5 mm or less by the first and second binding members 2410 and 2420, and thus, flexibility of the FPCB 2300 may be improved and damage to the FPCB 2300 due to the rotating force of the camera portion 2100 may be reduced or prevented.

According to an aspect of an exemplary embodiment, a width $L_{2330}$ of the region, in which the plurality of slits 2300Sa are formed, in the FPCB 2300 may be greater than a width $L_{2310}$ of the first end portion 2310 and a width $L_{2320}$ of the second end portion 2320.

As shown in FIG. 5A, a plurality of conductive lines 2340 connecting the first end portion 2310 and the second end portion 2320 to each other are not arranged in the region where the plurality of slits 2300Sa are located, and thus, in order to arrange the plurality of conductive lines 2340 in the region where the plurality of slits 2300Sa are formed, the width $L_{2330}$ of the FPCB 2300 has to increase. Here, the widths $L_{2310}$, $L_{2320}$, and $L_{2330}$ denote widths in a direction substantially perpendicular to a lengthwise direction connecting the first end portion 2310 and the second end portion 2320 of the FPCB 2300 to each other.

Referring to FIG. 5B, the FPCB 2300 includes a flexible substrate 2350, the plurality of conductive lines 2340 arranged on the flexible substrate 2350 and extending in a lengthwise direction of the FPCB 2300, and an insulating cover 2360 covering the plurality of conductive lines 2340, and the plurality of slits 2300Sa formed in the FPCB 2300 may be a plurality of openings formed in a region corresponding to the space between the plurality of conductive lines 2340.

The plurality of slits 2300Sa may be arranged throughout a first region 2330a surrounded by the first binding member 2410 of the FPCB 2300, a second region 2330b surrounded by the second binding member 2420, and a third region 2330c between the first region 2330a and the second region 2330b. The FPCB 2300 includes the plurality of branches 2300b that are partitioned from one another by the plurality of slits 2300Sa in at least a partial area, and the plurality of branches 2300b may be completely separated from one another in the third region 2330c.

As described above, the plurality of branches 2300b may be stacked in at least the first and second regions 2330a and 2330b so that surfaces of the branches 2300b sequentially contact one another respectively by the first binding member 2410 and the second binding member 2420, and a width L2300b of each of the branches 2300b may be about 5 mm or less.

Since the first region 2330a and the second region 2330b are bound by the first and second binding members 2410 and 2420, the FPCB 2300 may not be easily damaged even when the camera portion 2100 rotates in various angles with respect to the main circuit board 2210, and the third region 2330c is not bound, so that the flexibility of the FPCB 2300 may be improved. In addition, the FPCB 2300 corresponding to the third region 2330c is completely partitioned into the plurality of branches by the plurality of slits 2330Sa, and thus, the flexibility of the FPCB 2300 may be further improved.

The FPCB 2300 according to the present embodiment may further include a plurality of auxiliary slits 2300Sb arranged adjacent to the first end portion 2310. The plurality of auxiliary slits 2300Sb may be completely separated from the plurality of slits 2300Sa formed throughout the first region 2330a, the second region 2330b, and the third region 2330c.

According to the present embodiment, a region between the second binding member 2420 and the second end portion 2320 in the FPCB 2300 includes a fourth region 2330d in which the plurality of slits 2300Sa are formed and a fifth region 2330e arranged between the fourth region 2330d and the second end portion 2320 and having a substantially constant width. In addition, a length d of the fourth region 2330d in the lengthwise direction and a width L of the fifth region 2330e may satisfy a condition, e.g., 0.5<d/L<2.

That is, the distance d between the fifth region 2330e and the second binding member 2420 may be 0.5 times to 2 times longer than the width L of the fifth region 2330e.

If the value of d/L is less than or equal to 0.5, a distance from the second binding member 2420 to the portion where the plurality of slits 2300Sa are not arranged is too short, and thus, the fifth region 2330e may be crinkled by the second binding member 2420. In this case, the second end portion 2320 of the FPCB 2300 may be curved or crinkled, and accordingly, a defective connection between the second end portion 2320 and the second connector 2201 may occur.

In addition, if the value of d/L is greater than or equal to 2, a length of the third region 2330c may be too short. In this case, since the camera portion 2100 repeatedly rotates with respect to the main circuit board 2210, the FPCB 2300 may be damaged.

In FIG. 4, the fourth region 2330d and the fifth region 2330e are defined as regions between the second binding member 2420 and the second end portion 2320, but the fourth region 2330d and the fifth region 2330e may be regions between the first binding member 2410 and the first end portion 2310. That is, in the space between the first binding member 2410 and the first end portion 2310, a region where the plurality of slits 2300Sa are formed may be defined as the fourth region 2330d and a region between the fourth region 2330d and the first end portion 2310 may be defined as the fifth region 2330e.

Likewise, a length of the fourth region 2330d between the first binding member 2410 and the first end portion 2310 in the lengthwise direction and a width L of the fifth region 2330e may satisfy a condition, e.g., 0.5<d/L<2.

As described above, the FPCB 1300 or 2300 may be partially bound by the first binding member 1410 or 2410 and the second binding member 1420 or 2420 that are spaced apart from each other, and thus, damage to the FPCB 1300 or 2300 due to the panning and rolling operations of the camera portion 100 or 2100 with respect to the main circuit board 210 or 2210 may be prevented or reduced.

In addition, since the plurality of slits 2300Sa is formed in the region between the first binding member 1410 or 2410 and the second binding member 1420 or 2420, damage to the FPCB 1300 or 2300 may be prevented and flexibility of the FPCB 1300 or 2300 may be improved.

Figure 6:
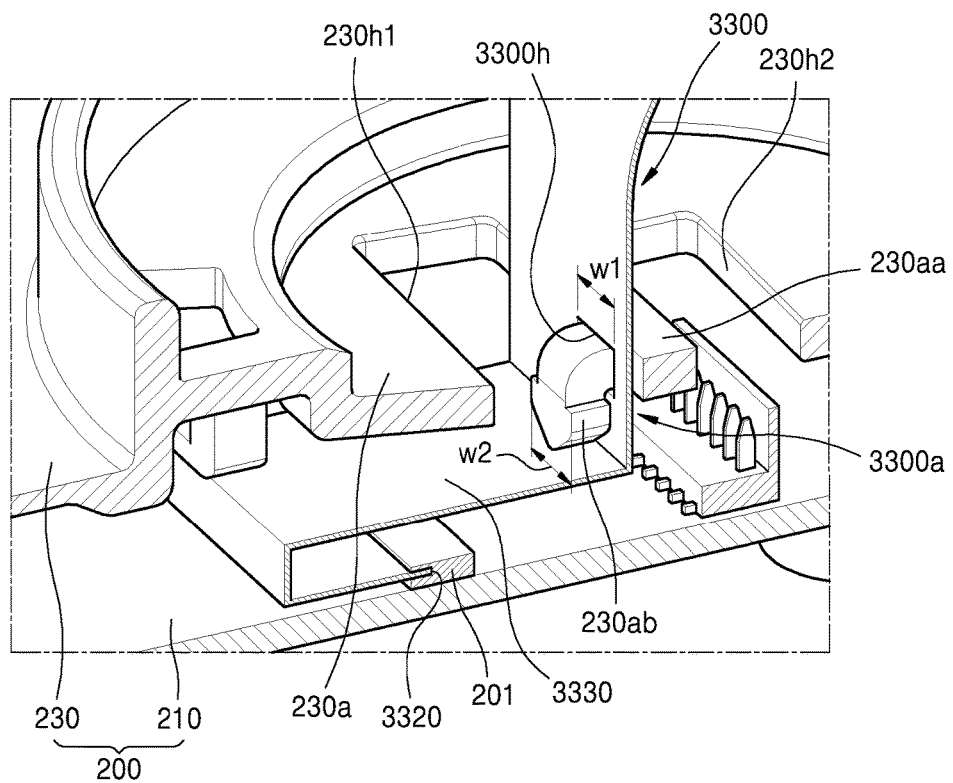
FIG. 6 is a partially cut perspective view of a surveillance camera system according to an exemplary embodiment.
Figure 7:
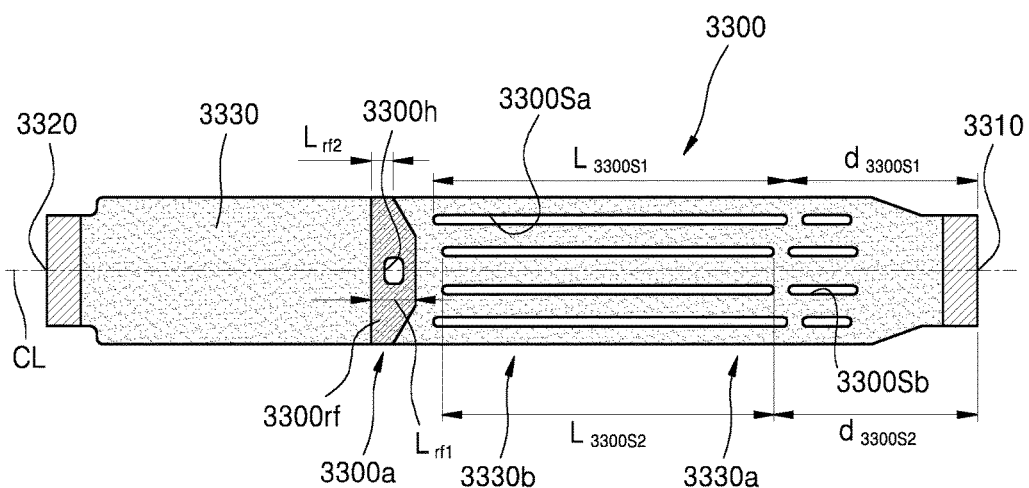
FIG. 7 is a schematic plan view of an FPCB included in FIG. 6.

FIG. 6 is a partial cross-sectional perspective view of a surveillance camera system according to an exemplary embodiment, and FIG. 7 is a schematic plan view of an FPCB 3300 included in FIG. 6.

In detail, FIG. 6 is a perspective view showing a region where the FPCB 3300 is connected to the main circuit board 210 of the base portion 200 and a region where a fixing portion (e.g., attachment point) 3300a of the FPCB 3300 is fixed on the base portion 200, and FIG. 7 is a plan view only showing the FPCB 3300 connecting the camera portion 100 (FIG. 2) to the main circuit board 210.

Referring to FIGS. 6 and 7, the FPCB 3300 includes a first end portion 3310, a second end portion 3320, and a conductive line extension portion 3330 arranged between the first end portion 3310 and the second end portion 3320. A plurality of conductive lines 2340 (see FIG. 5A) connecting the first end portion 3310 to the second end portion 3320 may be arranged in the conductive line extension portion 3330. A flexible substrate and an insulating cover may be arranged respectively on and under the plurality of conductive lines 2340.

The second connector 201 is arranged on the main circuit board 210, and the second end portion 3320 of the FPCB 3300 may be inserted and coupled to the second connector 201 to be fixed by the second connector 201. The FPCB 3300 includes the fixing portion 3300a spaced apart from the second end portion 3320 and fixed on the upper support 230 of the base portion 200, and a coupling hole 3300h may be formed in the fixing portion 3300a.

The upper support 230 covering the main circuit board 210 may include a frame 230a including a through hole 230h1, through which the FPCB 1300 penetrates, and a fixing hook 230ab arranged in the through hole 230h1 and protruding towards the through hole 230h1.

The fixing hook 230ab may be inserted to the coupling hole 3300h of the FPCB 3300. That is, through the above coupling manner, the fixing portion 3300a of the FPCB 3300 may be fixed on the base portion 200. In detail, the coupling hole 3300h of the FPCB 3300 has a first width W1 and the fixing hook 230ab may include a region having a second width W2 that is greater than the first width W1. Since the FPCB 3300 is flexible, an external force may be applied to expand the first width W1 of the coupling hole 3300h so as to penetrate through the region having the second width W2 in the fixing hook 230ab. However, in a state where the external force is not applied, the coupling hole 3300h maintains the first width W1, and thus, it may not pass through the region having the second width W2 in the fixing hook 230ab. That is, the FPCB 3300 may be coupled to the base portion 200 so as not to be separated from the fixing hook 230ab while the FPCB 3300 is in use.

According to an aspect of an exemplary embodiment, the upper support 230 further includes an additional opening 230h2 in addition to the through hole 230h1, and a bridge portion 230aa may be arranged between the through hole 230h1 and the additional opening 230h2 so as to separate the through hole 230h1 and the additional opening 230h2 from each other. The fixing hook 230ab may protrude from the bridge portion 230aa.

According to the above configuration, the FPCB 3300 may be coupled to the base portion 200 by inserting the coupling hole 3300h to the fixing hook 230ab, and thus, separation of the FPCB 3300 from the base portion 200 may be prevented.

According to an aspect of an exemplary embodiment, a plurality of slits 3300Sa are arranged between the fixing portion 3300a and the first end portion 3310. The plurality of slits 3300Sa are formed in a space where the conductive lines 2340 (see FIG. 5A) do not pass through, and may be a plurality of openings extending in a lengthwise direction connecting the first end portion 3310 to the second end portion 3320.

In the FPCB 3300, the region where the plurality of slits 3300Sa are formed may include a first region 3330a surrounded by the first binding member 2410 (see FIG. 4) and a second region 3330b surrounded by the second binding member 2420 (see FIG. 4).

The plurality of slits 3300Sa may include slits having different lengths from one another. For example, a length $L_{3300S2}$ of slits arranged adjacent to a center line CL extending in a direction connecting the first end portion 3310 to the second end portion 3320 of the FPCB 3300 may be less than a length $L_{3300S1}$ of slits arranged farther from the center line CL. That is, lengths of the plurality of slits 3300Sa may increase as they are arranged farther away from the center line CL of the FPCB 3300.

Also, a distance $d_{3300S2}$ between one end of the slit adjacent to the center line CL of the FPCB 3300 and the first end portion 3310 may be greater than a distance $d_{3300S1}$ between one end of the slit arranged far from the center line CL and the first end portion 3310. That is, the distance between each of the plurality of slits 3300Sa and the first end portion 3310 may decrease as they are arranged farther away from the center line CL of the FPCB 3300.

Through the above configuration, ends of the plurality of slits 3300Sa may match with one another in a state where the FPCB 3300 is bound at the first region 3330a and the second region 3330b. That is, if distances between the plurality of slits 3300Sa and the first end portion 3310 are equal to each other, the slits far from the center line CL of the FPCB 3300 are pulled towards the center portion of the FPCB 3300 when the FPCB 3300 is bound, and then, a force may be applied to the slits in a direction of being apart from the first end portion 3310. Due to the above force, an outer region apart from the center line CL of the FPCB 3300 may be curved. Due to the curvature, it may be difficult to couple the first end portion 3310 to the first connector 101 (see FIG. 2) arranged in the camera portion 100 (see FIG. 2), and during the coupling process, the FPCB 3300 may be damaged.

The FPCB 3300 is arranged between the first region 3330a and the first end portion 3310, and may further include a plurality of auxiliary slits 3300Sb that are separated from the plurality of slits 3300Sa. The plurality of auxiliary slits 3300Sb may include slits of different lengths from one another, for example, lengths of the plurality of auxiliary slits 3300Sb may decrease as they are arranged farther away from the center line CL of the FPCB 3300.

The plurality of auxiliary slits 3300Sb are arranged between the first region 3330a bound by the first binding member 2410 (see FIG. 4) and the first end portion 3310, and thus, the first end portion 3310 may be easily coupled to the first connector 101 (see FIG. 2).

According to an aspect of an exemplary embodiment, a reinforcing region 3300rf that has a greater rigidity than that of other regions in the FPCB 3300 may be arranged between the plurality of slits 3300Sa and the second end portion 3320.

A length $L_{rf1}$ of a region in the reinforcing region 3300rf, the region being adjacent to the center line CL of the FPCB 3300, may be greater than a length $L_{rf2}$ of a region in the reinforcing region 3300rf, the region being apart from the center line CL. Here, the length denotes a distance in the lengthwise direction connecting the first end portion 3310 and the second end portion 3320 of the FPCB 3300.

As described above, the camera portion 100 is supported to be capable of panning, tilting, and rolling with respect to the base portion 200, and thus, damage to the FPCB 3300 may occur because the plate-shaped FPCB 3300 is twisted or crinkled according to the rotation of the camera portion 100. In order to prevent the damage to the FPCB 3300, the plurality of slits 3300Sa may be formed in a region between the fixing portion 3300a and the first end portion 3310. The region between the fixing portion 3300a and the first end portion 33100 may be affected by the rotation of the camera portion 100. That is, the flexibility of the FPCB 3300 may be improved by forming the plurality of slits 3300Sa, and moreover, twisting or crinkling of the FPCB 3300 is alleviated to prevent damage to the FPCB 3300.

According to an aspect of an exemplary embodiment, the plurality of slits 3300Sa may not be arranged in a region between the fixing portion 3300a and the second end portion 3320. The second end portion 3320 is a portion to be connected to the main circuit board 210 and the fixing portion 3300a is coupled to the base portion 200, and thus, the region between the fixing portion 3300a and the second end portion 3320 may not be affected by the rotation of the camera portion 100. That is, even when the camera portion 100 rotates with respect to the base portion 200, the force caused by the rotation is absorbed by the fixing portion 3300a and may not be transferred to the second end portion 3320. Therefore, even if the plurality of slits 3300Sa are not arranged in the region between the fixing portion 3300a and the second end portion 3320, twisting or crinkle of the FPCB 3300 may not occur. However, the present disclosure is not limited thereto, that is, the plurality of slits 3300Sa may be also arranged between the fixing portion 3300a and the second end portion 3320.

Figure 8:
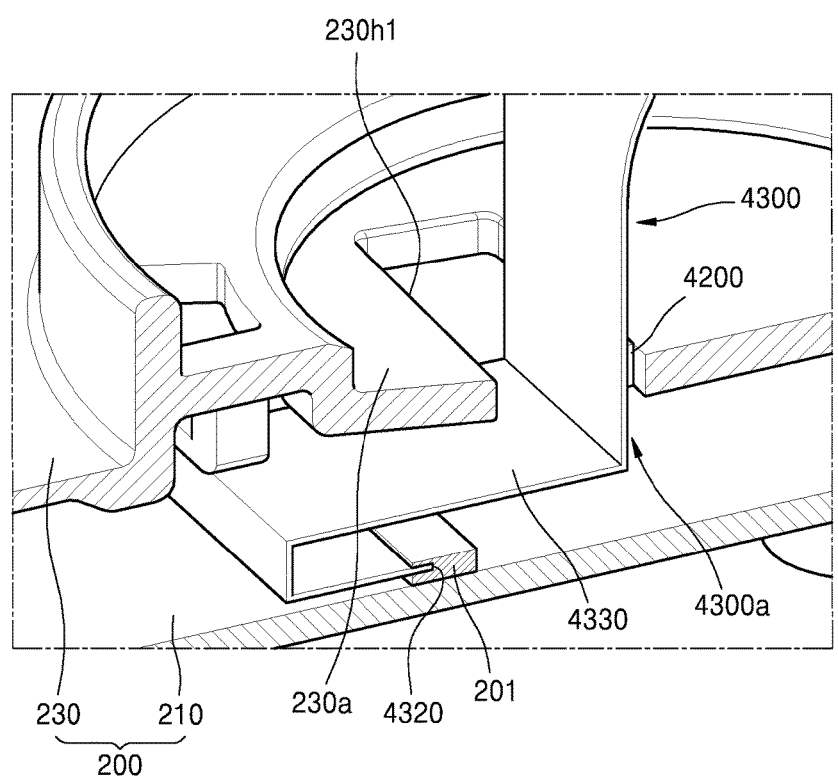
FIG. 8 is a partially cut perspective view of a surveillance camera system according to an exemplary embodiment.

FIG. 8 is a partial cross-sectional perspective view of a surveillance camera system according to an exemplary embodiment.

Referring to FIG. 8, the surveillance camera system includes the camera portion 100 (see FIG. 2), the base portion 200 supporting the camera portion 100 to be rotatable and including the main circuit board 210, and an FPCB 4300 connecting the camera portion 100 to the main circuit board 210. The FPCB 4300 includes a first end portion connected to the camera portion 100, a second end portion 4320 connected to the main circuit board 210, and a conductive line extension portion 4330 between the first end portion and the second end portion 4320, wherein the conductive line extension portion 4330 also includes a fixing portion 4300a coupled to the base portion 200 at a location apart from the main circuit board 210.

Components other than the fixing portion 4300a in the surveillance camera system of FIG. 8 are the same as those of FIG. 6, and hereinafter, only the fixing portion 4300a will be described.

The second end portion 4320 of the FPCB 4300 is connected to the second connector 201 arranged in the main circuit board 210, and the FPCB 4300 may include the fixing portion 4300a coupled to the base portion 200 at a location apart from the main circuit board 210. The base portion 200 includes the through hole 230h1, through which the FPCB 4300 penetrates while covering the main circuit board 210, and a frame 230a surrounding the through hole 230h1. The fixing portion 4300a of the FPCB 4300 may be attached to the frame 230a that surrounds the through hole 230h1. That is, an attaching unit 4200 is arranged between the FPCB 4300 and at least a part of the frame 230a, and the fixing portion 4300a of the FPCB 4300 may be coupled to the upper support 230 via the attaching unit 4200.

Figure 9:
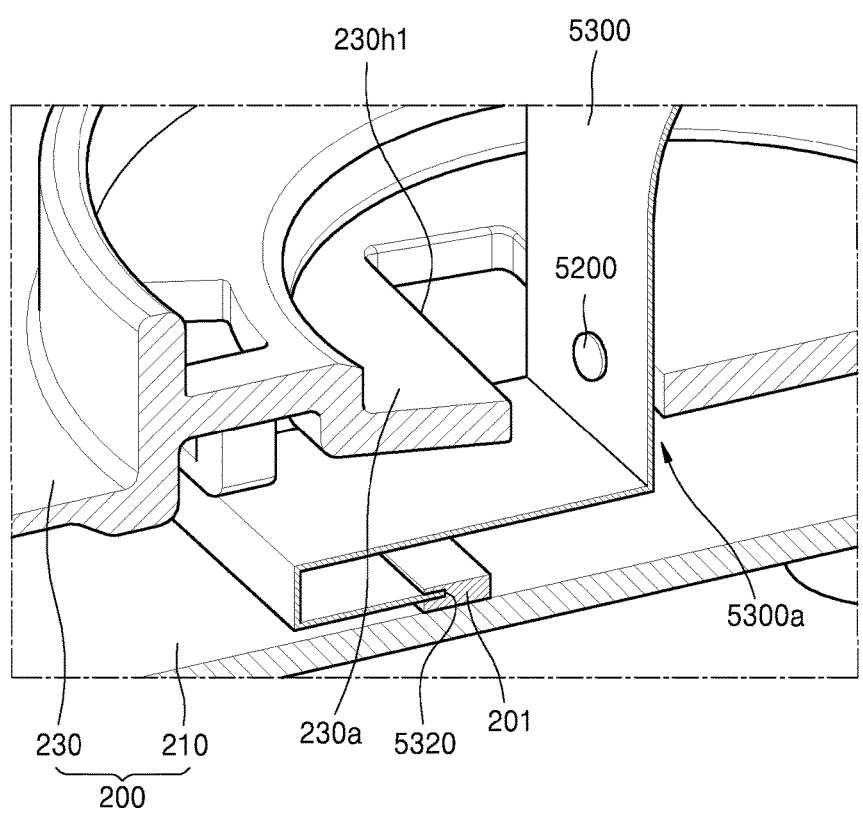
FIG. 9 is a partially cut perspective view of a surveillance camera system according to an exemplary embodiment.

FIG. 9 is a partial cross-sectional perspective view of a surveillance camera system according to an exemplary embodiment.

Referring to FIG. 9, the surveillance camera system includes the camera portion 100 (see FIG. 2), the base portion 200 supporting the camera portion 100 to be rotatable and including the main circuit board 210, and an FPCB 5300 including a first end portion (not shown) connecting the camera portion 100 to the main circuit board 210 and connected to the camera portion 100, a second end portion 5320 connected to the main circuit board 210, and a conductive line extension portion 5330 between the first end portion and the second end portion 5320, wherein the conductive line extension portion 5330 also includes a fixing portion 5300a coupled to the base portion 200 at a location apart from the main circuit board 210.

Components other than the fixing portion 5300a in the surveillance camera system of FIG. 9 are the same as those of FIG. 6, and hereinafter, only the fixing portion 5300a will be described.

According to an aspect of an exemplary embodiment, the second end portion 5320 of the FPCB 5300 is connected to the second connector 201 arranged in the main circuit board 210, and the FPCB 5300 may include the fixing portion 5300a coupled to the base portion 200 at a location apart from the main circuit board 210. The base portion 200 includes the through hole 230h1, through which the FPCB 5300 penetrates while covering the main circuit board 210, and a frame 230a surrounding the through hole 230h1, and the fixing portion 5300a of the FPCB 5300 may be coupled to the frame 230a that surrounds the through hole 230h1 via a fixing unit 5200 such as a pin or a screw.

As described above, the surveillance camera system according to various exemplary embodiment includes the FPCB 3300, 4300, or 5300 including the fixing portion 3300a, 4300a, or 5300a fixed on the base portion 200, so that the fixing portion 3300a, 4300a, or 5300a prevents the rotary force of the camera portion 100 transferred to the FPCB 3300, 4300, or 5300 from being transferred to the second end portion 3320, 4320, or 5320 connected to the main circuit board 210. Accordingly, detachment of the FPCB 3300, 4300, or 5300 from the base portion 200 may be prevented.

In addition, the FPCB 1300, 2300, or 3300 is partially bound by the first binding member 1410 or 2410 and the second binding member 1420 or 2420 that are spaced apart from each other, and thus, damage to the FPCB 1300, 2300, or 3300 due to the panning and rolling operations of the camera portion 100 or 2100 with respect to the main circuit board 210 or 2210 may be prevented or reduced.

In addition, since the plurality of slits 2300Sa or 3300Sa are formed in the region between the first binding member 1410 or 2410 and the second binding member 1420 or 2420, damage to the FPCB 1300, 2300, or 3300 may be prevented and flexibility of the FPCB 1300, 2300, or 3300 may be improved. One or more features illustrated herein with respect to the various exemplary embodiments may be combined with each other. For example, any one of the binding members 1410, 1420, 2410, 2420, the slits 2300Sa, etc. as described with reference to FIGS. 2, 4, 5A, 5B may be implemented with any of the FPCBs 1300, 2300, 3300, 4300, 5300.

According to one or more embodiments, the surveillance camera system capable of preventing damage to the FPCB with low expenses may be provided.

However, the scope of the present disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:
1. A surveillance camera system comprising:
a camera portion;

a base portion supporting the camera portion to be rotatable, and comprising a main circuit board;

a flexible printed circuit board (FPCB) connecting the camera portion to the main circuit board, and comprising a first end portion connected to the camera portion, a second end portion connected to the main circuit board, and a conductive line extension portion disposed between the first end portion and the second end portion, wherein a plurality of slits are arranged in the conductive line extension portion; and at least one binding member surrounding a part of the conductive line extension portion, wherein the plurality of slits comprise slits having varying lengths, and wherein the lengths of the plurality of slits increase as the plurality of slits are arranged farther away from a center line of the FPCB, and the center line is a line extending along a lengthwise direction of the FPCB.

2. The surveillance camera system of claim 1, wherein the plurality of slits are a plurality of openings having widths substantially equal to one another.

3. A surveillance camera system comprising:

a camera portion;

a base portion supporting the camera portion to be rotatable, and comprising a main circuit board;

a flexible printed circuit board (FPCB) connecting the camera portion to the main circuit board, and comprising a first end portion connected to the camera portion, a second end portion connected to the main circuit board, and a conductive line extension portion disposed between the first end portion and the second end portion, wherein a plurality of slits are arranged in the conductive line extension portion; and at least one binding member surrounding a part of the conductive line extension portion, wherein the plurality of slits comprise slits having varying lengths, and wherein distances between the plurality of slits and the first end portion decrease as the plurality of slits are arranged farther away from a center line of the FPCB, and the center line is a line extending along a lengthwise direction of the FPCB.

4. A surveillance camera system comprising:

a camera portion;

a base portion supporting the camera portion to be rotatable, and comprising a main circuit board;

a flexible printed circuit board (FPCB) connecting the camera portion to the main circuit board, and comprising a first end portion connected to the camera portion, a second end portion connected to the main circuit board, and a conductive line extension portion disposed between the first end portion and the second end portion, wherein a plurality of slits are arranged in the conductive line extension portion; and at least one binding member surrounding a part of the conductive line extension portion, wherein a width of a region where the plurality of slits are arranged in the FPCB is greater than each of a width of the first end portion and a width of the second end portion, and the width of the region is a width in a direction substantially perpendicular to a lengthwise direction of the FPCB.

5. A surveillance camera system comprising:

a camera portion;

a base portion supporting the camera portion to be rotatable, and comprising a main circuit board;

a flexible printed circuit board (FPCB) connecting the camera portion to the main circuit board, and comprising a first end portion connected to the camera portion, a second end portion connected to the main circuit board, and a conductive line extension portion disposed between the first end portion and the second end portion, wherein a plurality of slits are arranged in the conductive line extension portion; and a first binding member and a second binding member respectively surrounding a part of the conductive line extension portion and being spaced apart from each other, wherein the plurality of slits are arranged throughout a first region surrounded by the first binding member, a second region surrounded by the second binding member, and a third region between the first region and the second region in the FPCB.

6. The surveillance camera system of claim 5, wherein the FPCB comprises a plurality of branches separated from one another by the plurality of slits in at least a partial area, and the plurality of branches are separated from one another in the third region.

7. The surveillance camera system of claim 6, wherein the plurality of branches are stacked so that surfaces of the plurality of branches sequentially contact one another in at least the first region and the second region respectively by the first binding member and the second binding member.

8. The surveillance camera system of claim 7, wherein each of the plurality of branches has a width of 5 mm or less.

9. The surveillance camera system of claim 5, further comprising a plurality of auxiliary slits arranged between the first region and the first end portion, and separated from the plurality of slits.

10. The surveillance camera system of claim 9, wherein the plurality of auxiliary slits comprise slits having varying lengths.

11. The surveillance camera system of claim 10, wherein the lengths of the plurality of auxiliary slits decrease as the plurality of auxiliary slits are arranged farther away from a center line of the FPCB, and the center line is a line extending along a lengthwise direction of the FPCB.

12. The surveillance camera system of claim 5, wherein the FPCB comprises a reinforcing region arranged between the second region and the second end portion and having a rigidity greater than rigidities of other regions of the FPCB.

13. The surveillance camera system of claim 12, wherein a length of the reinforcing region at a first portion adjacent to a center line of the FPCB is greater, in a lengthwise direction of the FPCB, than a length of the reinforcing region at a second portion farther away than the first portion from the center line.

14. The surveillance camera system of claim 1, wherein the FPCB comprises:

a flexible substrate;

a plurality of conductive lines arranged on the flexible substrate and extending in a lengthwise direction of the FPCB; and an insulating cover covering the plurality of conductive lines, wherein the plurality of slits are a plurality of openings formed in a region corresponding to a space between the plurality of conductive lines of the insulating cover and the flexible substrate.

15. The surveillance camera system of claim 5, wherein a region in the FPCB between the second binding member and the second end portion comprises:

a fourth region in which the plurality of slits are arranged; and a fifth region arranged between the fourth region and the second end portion, the fifth region having a constant width wherein a length d of the fourth region in a lengthwise direction of the FPCB and a width L of the fifth region in a direction perpendicular to the lengthwise direction satisfies a condition 0.5<d/L<2, and wherein the lengthwise direction denotes a direction of a line connecting the first end portion to the second end portion.

16. The surveillance camera system of claim 5, wherein a region in the FPCB between the first binding member and the first end portion comprises:

a fourth region in which the plurality of slits are arranged; and a fifth region arranged between the fourth region and the second end portion, the fifth region having a constant width, wherein a length d of the fourth region in a lengthwise direction of the FPCB and a width L of the fifth region in a direction perpendicular to the lengthwise direction satisfies a condition 0.5<d/L<2, wherein the lengthwise direction denotes a direction of a line connecting the first end portion to the second end portion.

17. The surveillance camera system of claim 1, wherein the camera portion comprises a lens system and an image sensor receiving light that has passed through the lens system to convert the light into an electric signal, and the first end portion of the FPCB is connected to the image sensor.

18. The surveillance camera system of claim 1, wherein the camera portion is supported by the base portion, to be capable of panning, tilting, and rolling with respect to the base portion.

* * * * *